US006201287B1

(12) United States Patent
Forbes (10) Patent No.: US 6,201,287 B1
(45) Date of Patent: Mar. 13, 2001

(54) MONOLITHIC INDUCTANCE-ENHANCING INTEGRATED CIRCUITS, COMPLEMENTARY METAL OXIDE SEMICONDUCTOR (CMOS) INDUCTANCE-ENHANCING INTEGRATED CIRCUITS, INDUCTOR ASSEMBLIES, AND INDUCTANCE-MULTIPLYING METHODS

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/179,544

(22) Filed: Oct. 26, 1998

(51) Int. Cl.[7] .................................................. H01L 29/00
(52) U.S. Cl. ........................... 257/528; 257/531; 438/381
(58) Field of Search ..................................... 257/531, 528; 438/381

(56) References Cited

U.S. PATENT DOCUMENTS

| 4,661,785 | 4/1987 | Benjaminson | 331/109 |
|---|---|---|---|
| 4,767,980 | 8/1988 | Chen et al. | 323/356 |
| 5,047,728 | 9/1991 | Bayruns | 330/277 |
| 5,175,513 | 12/1992 | Hara | 331/115 |
| 5,303,394 | 4/1994 | Hrncirik | 455/84 |
| 5,736,913 | 4/1998 | Sanyigo et al. | 333/246 |
| 5,760,456 | * 6/1998 | Grzegorek et al. | 257/531 |
| 5,952,893 | * 9/1999 | Ghoshal | 331/108 C |
| 6,002,161 | * 12/1999 | Yamazaki | 257/531 |
| 6,057,202 | * 5/2000 | Chen et al. | 438/381 |

OTHER PUBLICATIONS

Burns, Lawrence M., "Applications for GaAs and Silicon Integrated Circuits in Next Generation Wireless Communications Systems", IEEE Journal of Solid–State Circuits, vol. 30, No. 10, Oct. 1995, pp. 1088–1095.

Chang, J. Y.–C. et al., "Large Suspended Inductors on Silicon and Their Use in a 2–μm CMOS RF Amplifier", IEEE Electrical Device Letters, vol. 14, No. 5, May 1993, pp. 246–248.

(List continued on next page.)

Primary Examiner—William Mintel
(74) Attorney, Agent, or Firm—Wells, St. John, Roberts, Gregory & Matkin P.S.

(57) ABSTRACT

Monolithic inductance-enhancing integrated circuits, complementary metal oxide semiconductor (CMOS) inductance-enhancing integrated circuits, inductor assemblies, and inductance-multiplying methods are described. In one embodiment, a monolithic inductance-enhancing integrated circuit comprises a transistor supported by a bulk monocrystalline silicon substrate. An inductor assembly is supported by the substrate and operably connected with the transistor in an inductance-enhancing circuit configuration having a quality factor (Q) greater than 10. In another embodiment, a complementary metal oxide semiconductor (CMOS), inductance-enhancing integrated circuit includes a field effect transistor supported over a silicon-containing substrate and having a gate, a source, and a drain. A first inductor is received within an insulative material layer over the substrate, and is connected to the gate. A second inductor is received within the insulative material layer and is connected to the source. The first and second inductors are arranged in a feedback loop which incorporates the field effect transistor. In yet another embodiment, a monolithic substrate is provided having formed thereon integrated circuitry which is formed through complementary metal oxide semiconductor (CMOS) techniques and includes a field effect transistor and a pair of inductors. The transistor and inductor pair are arranged into a circuit configuration in which the field effect transistor can sample one of the pair of inductors and drive the other of the pair of inductors in a manner which effectively increases the inductance of the sampled inductor.

34 Claims, 7 Drawing Sheets

OTHER PUBLICATIONS

Burghartz, Joachim N., et al., "Integrated RF and Microwave Components in BiCMOS Technology", IEEE Transactions on Electron Devices, vol. 43, No. 9, Sep. 1996, pp. 1559–1570.

Y. Imai et al., "On the Realization of LC Simulation Circuits Using Operational Amplifiers", Trans. Inst. Electronics and Communications Engineers of Japan, vol. E61, No. 5, p. 388, 1978.

Hitko, Donald A., et al., "A IV, %mW, 1.8 GHz, Balanced Voltage–Controlled Oscillator with an Integrated Resonator", Microsytems Technology Laboratories, MIT, Cambridge, MA, Analog Devices, Inc., Wilmington, MA, pp. 46–51.

Forbes, L. et al., "Resonant Forward–Biased Guard–Ring Diodes for Suppressio of Substrate Noise in Mixed–Mode CMOS Circuits", IEE Electronics Letts., vol. 31, No. 9, pp. 720–721, Apr. 1995.

* cited by examiner

MONOLITHIC INDUCTANCE-ENHANCING INTEGRATED CIRCUITS, COMPLEMENTARY METAL OXIDE SEMICONDUCTOR (CMOS) INDUCTANCE-ENHANCING INTEGRATED CIRCUITS, INDUCTOR ASSEMBLIES, AND INDUCTANCE-MULTIPLYING METHODS

TECHNICAL FIELD

The present invention relates to monolithic inductance-enhancing integrated circuits, to complementary metal oxide semiconductor (CMOS) inductance-enhancing integrated circuits, to inductor assemblies, and to inductance-multiplying methods

BACKGROUND OF THE INVENTION

As integrated circuit devices continue to shrink in dimension, the demand to integrate different functionalities on the same integrated circuit die continues to grow. For example, portable wireless communication products have become high volume consumer devices. Some of these devices are now operating in the 1–2 GHz frequency range. There is, as a consequence, a demand to integrate RF front end circuits into high-yield silicon integrated circuit processes to allow a combination of analog, digital, and RF functions on the same integrated circuit die. Yet, some considerable difficulty has been experienced in attempts to fabricate inductors having high quality factors (Q) in silicon technology for RF circuits which are used in communications.

Attempts have been made to build high-Q inductors in silicon integrated circuit technology, but have yielded Q factors of only three to eight. This is undesirable in the context of RF circuit design at frequencies in the above-stated range, where required Q factors need to be typically in a range from between 5–20 for broad-band applications, and may have to be higher than 30 in narrow-band networks. Problems associated with the use of silicon technology in these scenarios, in part, is a result of the conductivity of silicon substrates which tends to induce losses. As frequencies approach the self resonant frequency, the inductance value decreases which is most undesirable. Losses in the conductive silicon substrates can be increased by the high dielectric constant of the insulators under the conductors and the relatively large values of stray capacitance coupling to the silicon substrate.

Some attempts have been made to provide oxide-encased, spiral-type inductors for silicon technology, with such encased inductors being disposed over a cavity which is etched into the silicon substrate. Others have attempted to provide higher-Q inductors in a five or six-level metal BiCMOS technology. The conductors in these instances are still encased in oxide but are far removed from the silicon substrate by virtue of a large number of insulator and metal levels. The number of these levels, however, is far in excess of the two to four levels commonly utilized in CMOS technology.

Other attempts have been made to provide higher-Q inductors through the use of long pad-to-pad wire bond techniques in BiCMOS technology in the design and fabrication of voltage controlled oscillators. Wire bond inductors have previously been used in a variety of applications as inductors and for impedance matching networks and, more recently, to create low impedance resonant connections from guard rings or bonding pads to ground planes. Having the conductor surrounded by air rather than an insulator serves to reduce losses from the conductive silicon substrates and yield high-Q values (11 to 15 at 1.8 GHz). However, having such long unsupported spans of wire, e.g. up to three millimeters in some cases, does not provide for good mechanical stability. In addition, there is no provision for, nor is there a possibility of, passivation in these structures. Air bridge or wire bond inductors might have very good high-Q values, but their characteristics typically tend to be subject to change in the event of severe mechanical shocks or abrasion. In addition, such structures are not suitably protected from corrosive environments.

Against the backdrop of these attempts, there continues to remain a need in silicon integrated circuit technologies for high-Q inductors with rigid and fixed mechanical characteristics. Such inductors are, or can be, used in the design and implementation of oscillators, tuned amplifiers, and in optimizing broad band amplifiers. These cannot be achieved by standard integrated circuit techniques, nor by air bridge and/or suspended metal conductors.

Inductance and Q-multipliers have been used previously in low frequency telephony circuits where operational amplifiers with a low unity gain corner frequency have been employed as the active gain elements. Examples of such are described in U.S. Pat. No. 4,767,980. More complicated feedback circuits employing operational amplifiers at low frequencies have been utilized to achieve Q-multiplier circuits. Such are described in U.S. Pat. Nos. 5,303,394, and 4,661,785. It is difficult, however, to fabricate operational amplifiers in CMOS technology with a high unity gain frequency.

Accordingly, this invention arose out of concerns associated with providing improved structures and methods for enhancing the inductive quality of integrated circuits. Particularly, this invention arose out of concerns associated with providing such structures and methods in the context of CMOS technology. Such structures preferably have high Q values at the frequencies of interest.

SUMMARY OF THE INVENTION

Monolithic inductance-enhancing integrated circuits, complementary metal oxide semiconductor (CMOS) inductance-enhancing integrated circuits, inductor assemblies, and inductance-multiplying methods are described.

In one embodiment, a monolithic inductance-enhancing integrated circuit comprises a transistor supported by a bulk monocrystalline silicon substrate. An inductor assembly is supported by the substrate and operably connected with the transistor in an inductance-enhancing circuit configuration having a quality factor (Q) greater than 10. In another embodiment, a complementary metal oxide semiconductor (CMOS), inductance-enhancing integrated circuit includes a field effect transistor supported over a silicon-containing substrate and having a gate, a source, and a drain. A first inductor is received within an insulative material layer over the substrate, and is connected to the gate. A second inductor is received within the insulative material layer and is connected to the source. The first and second inductors are arranged in a feedback loop which incorporates the field effect transistor. In another embodiment, an inductor assembly comprises a semiconductive silicon substrate having first and second spiral-type inductors received thereover to define first and second respective inductor levels which, preferably, have no more than four inductor or metal levels. In yet another embodiment, a monolithic substrate is provided having formed thereon integrated circuitry which is formed through complementary metal oxide semiconductor (CMOS) techniques and includes a field effect transistor and a pair of inductors. The transistor and inductor pair are arranged into a circuit configuration in which the field effect transistor can sample one of the pair of inductors and drive the other of the pair of inductors in a manner which effectively increases the inductance of the sampled inductor. In another embodiment, first and second spiral-type inductors are provided over a semiconductive substrate. The output of the first spiral-type inductor is sampled with a field effect transistor and the second spiral-type inductor is driven with the field effect transistor thereby increasing the inductance of the first spiral-type inductor.

BRIEF DESCRIPTION OF THE DRAWINGS

Preferred embodiments of the invention are described below with reference to the following accompanying drawings.

FIG. 4 is a graph which is useful in understanding the operation of one or more embodiments of the invention.

FIG. 5 is a graph which is useful in understanding one or more embodiments of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
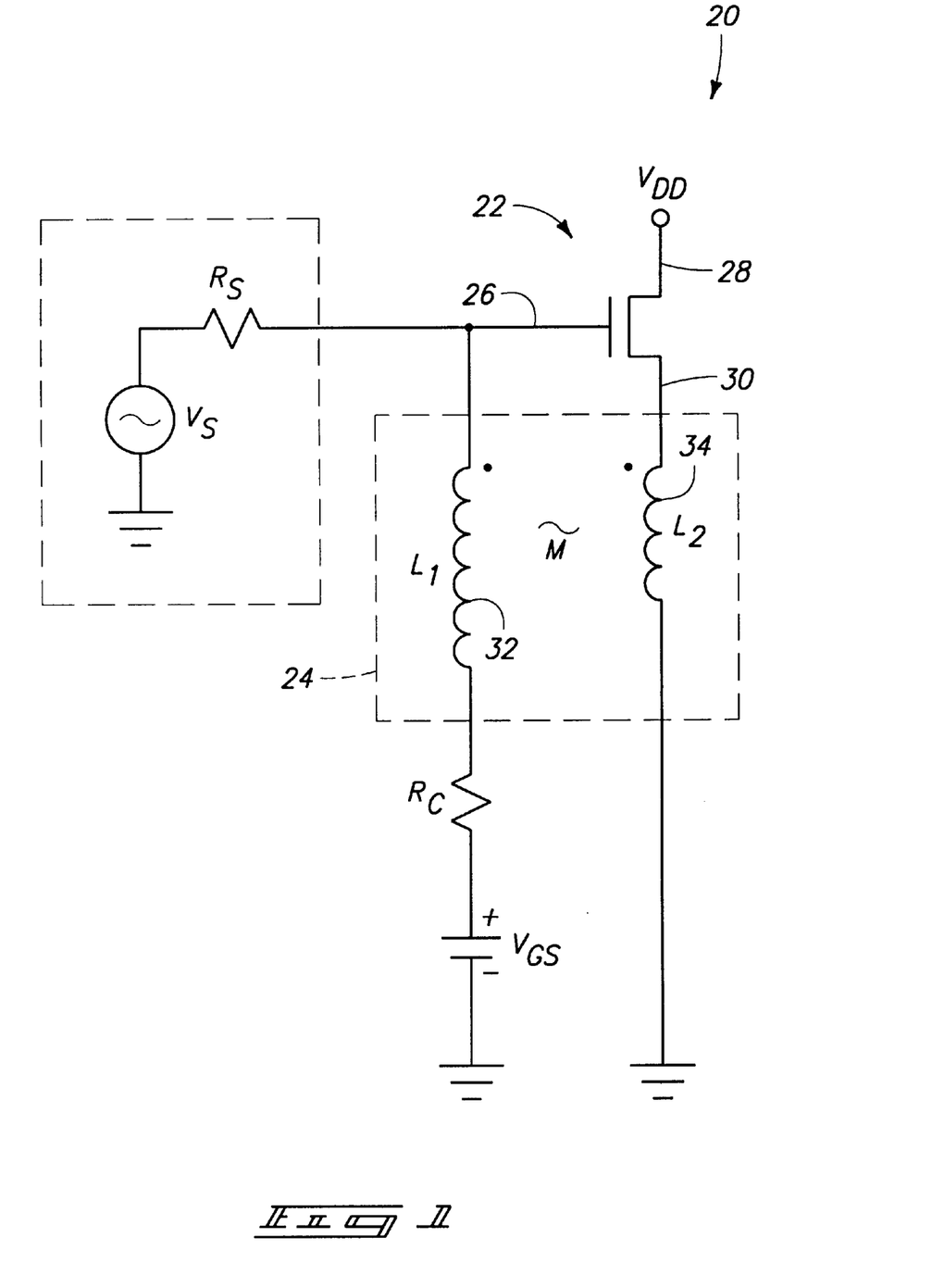
FIG. 1 is a schematic circuit diagram of a circuit in accordance with one embodiment of the invention.
Figures 8, 9:
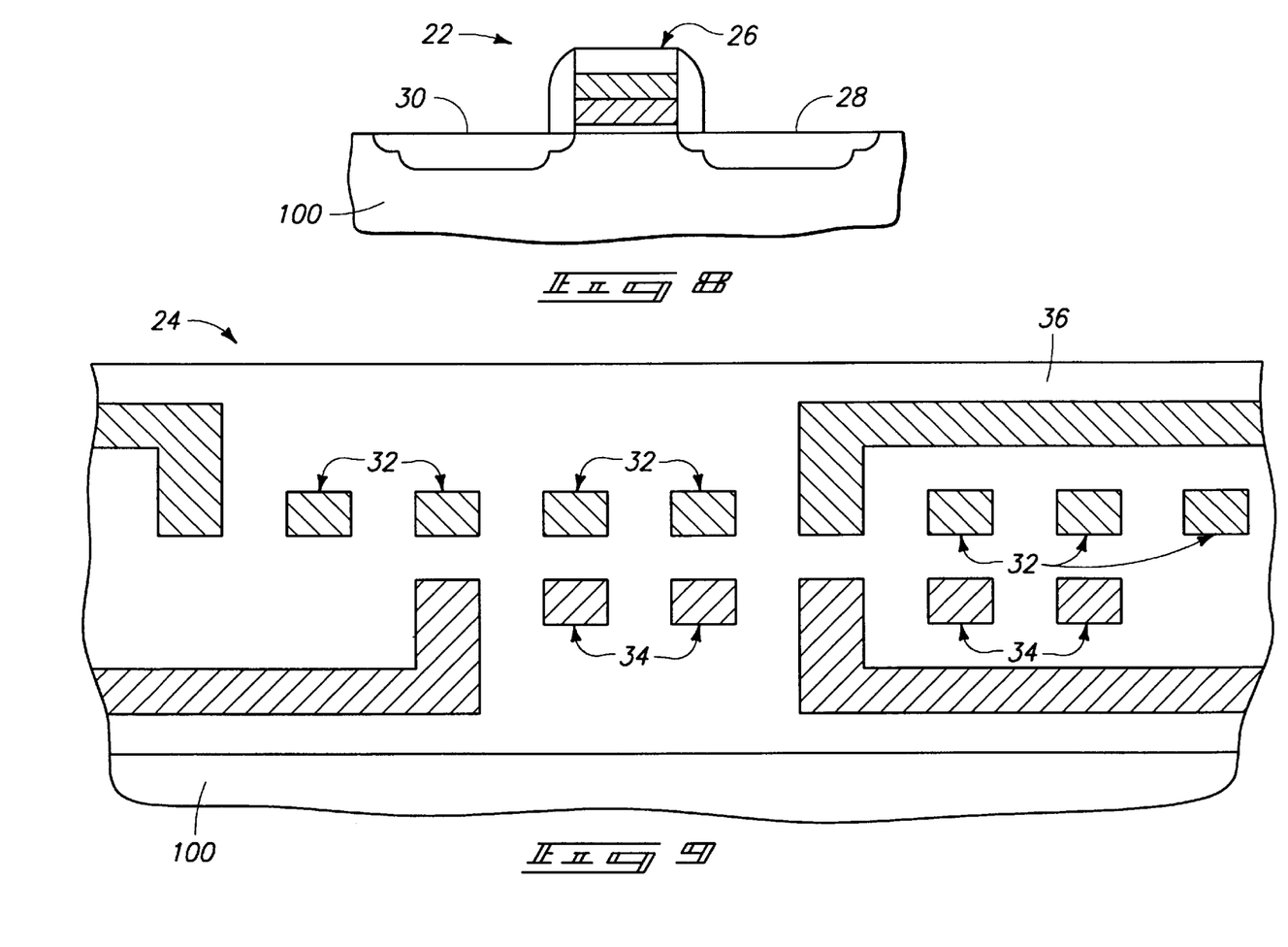
FIG. 8 is a diagrammatic side sectional view of one aspect of one embodiment of the present invention.
FIG. 9 is a diagrammatic side sectional view of an inductor assembly constructed in accordance with one embodiment of the invention.

Referring to FIG. 1, a schematic diagram of a circuit constructed in accordance with one embodiment of the invention is shown generally at 20. In one preferred embodiment, circuit 20 constitutes a monolithic, inductance-enhancing integrated circuit comprising a transistor 22 (FIGS. 1 and 8) supported by a bulk monocrystalline silicon substrate 100, and an inductor assembly supported by the substrate and indicated generally with reference numeral 24 (FIG. 9). Preferably, inductor assembly 24 is operably connected with transistor 22 in an inductance-enhancing circuit configuration having a quality factor greater than or equal to about 10. Operable interconnection of the integrated circuitry structures shown in FIGS. 8 and 9 can take place through known integrated circuit fabrication techniques. The illustrated circuit and the concepts embraced thereby constitute improvements over prior attempts to provide high-Q, silicon-integrated, monolithic circuits suitable for use in the gigahertz range.

In one specific embodiment, transistor 22 comprises a field effect transistor which is preferably a metal oxide semiconductor field effect transistor (MOSFET) as shown in FIG. 8. Accordingly, transistor 22 includes a gate 26, a drain 28, and a source 30. Preferably, inductor assembly 24 comprises a pair of inductors, e.g. first inductor 32 and second inductor 34. In the illustrated embodiment, first inductor 32 is connected to gate 26 and second inductor 34 is connected to source 30. In the particular illustrated circuit of FIG. 1, drain 28 of transistor 22 is connected to a voltage supply $V_{DD}$. Inductor 32 is connected between gate 26 and a voltage source $V_{GS}$, with a coil resistance $R_c$ being shown in series with inductor 32. Coil resistance $R_c$ represents the inherent resistance of the inductive coil. Inductor 34 is connected between source 30 and ground.

Figure 10:
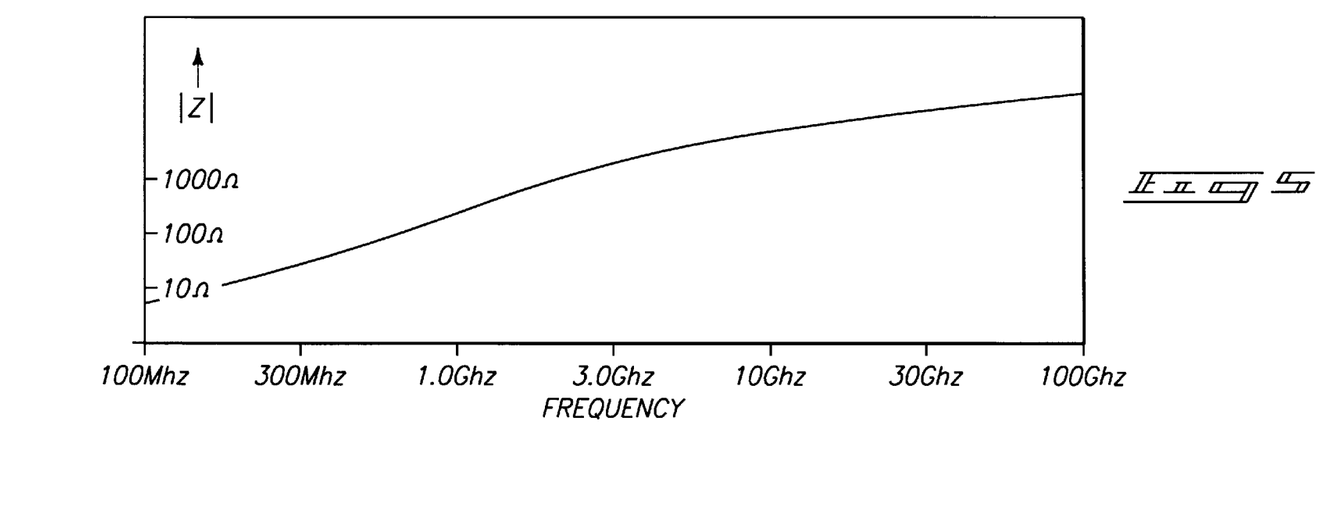
FIG. 10 is a top plan view of a spiral-type inductor in accordance with one embodiment of the invention.
Figure 11:
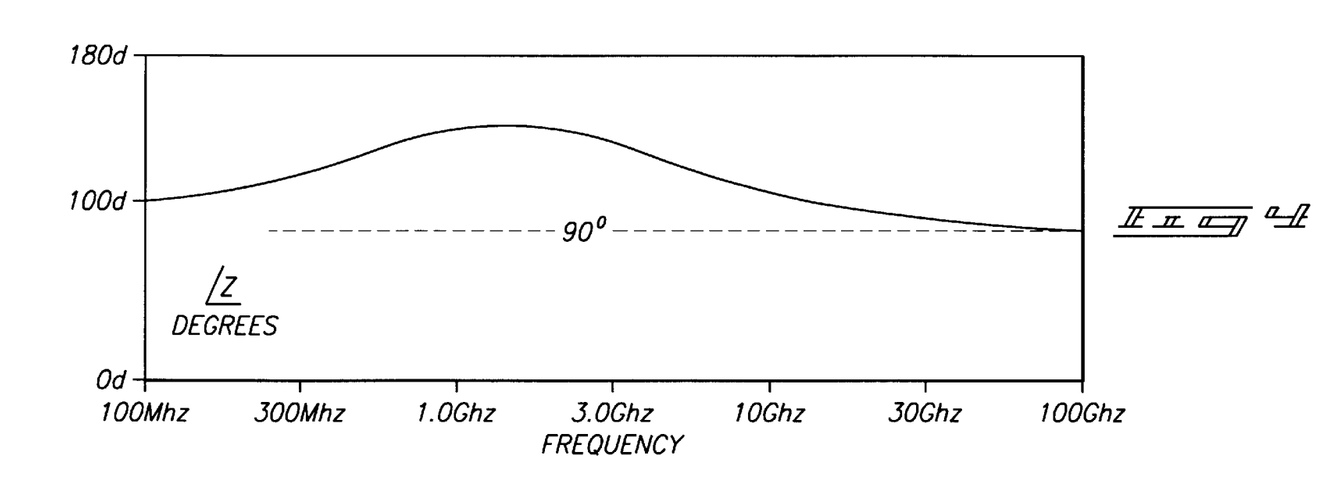

In a preferred embodiment and as best illustrated in FIGS. 9 and 10, inductor assembly 24 comprises a plurality of spiral-type inductors. Two such exemplary inductors are shown in cross-section at 32, 34 respectively, in FIG. 9. FIG. 10 shows a cross-hatched, top plan view of one such inductor. In the illustrated example (FIGS. 1 and 9), two such spiral-type inductors are shown. One of the inductors, e.g. inductor 32, is preferably larger than the other inductor 34. The inductors are preferably formed through integrated circuit techniques which can include, for example, damascene methods or subtractive methods. In damascene methods, trenches are formed in an insulative material in the pattern of a particular portion of an inductive element. Conductive material, e.g. aluminum, copper, or some other suitable material such as other metals, is subsequently deposited into the trenches, with unneeded metal being subsequently removed. In subtractive methods, a metal layer is formed over a substrate and subsequently patterned into a desired inductive element shape. In the instant example, the larger of the inductors, inductor 32, is formed or disposed over the smaller of the inductors, inductor 34 (FIG. 9).

In another preferred embodiment which is shown best in FIGS. 1, 8 and 9, a complementary metal oxide semiconductor (CMOS), inductance-enhancing integrated circuit 20 is provided. The circuit comprises a field effect transistor 22 received by and supported over a silicon-containing substrate 100. The transistor comprises a gate 26, a drain 28, and a source 30. A first inductor 32 is received within an insulative material layer 36 which is supported by substrate 100. First inductor 32 is connected, in this example, to gate 26. Second inductor 34 is provided and is received within insulative material layer 36. Second inductor 34 is preferably connected to source 30 of transistor 22. In this example, first and second inductors 32, 34 are arranged in a feedback loop (FIG. 1) which incorporates the field effect transistor. One of the first and second inductors 32, 34 respectively, is larger than the other of the first and second inductors. In this example, inductor 32 is larger than inductor 34. Preferably, one of the first and second inductors is a spiral-type inductor such as the inductive element shown in FIG. 10. Even more preferably, both of the first and second inductors are spiral-type inductors. Additionally, one of the inductors is preferably disposed over the other of the inductors. In the illustrated example, the larger of the inductors is received over the smaller of the inductors.

In another embodiment, an inductor assembly is provided over a semiconductive silicon substrate in an arrangement which is illustrated in FIG. 9. In a preferred embodiment, a first spiral-type inductor 32 is received over substrate 100 and defines a first inductor level. A second spiral-type inductor 34 is received over substrate 100 and is operably coupled with first spiral inductor 32 and defines a second inductor level. The inductor assembly preferably includes no more than four inductor or metal levels. In this specific example, the inductors each constitute an inductor or metal layer, and the conductive interconnects which extend above and below, and to the left and right, as viewed in the figure, constitute two other metal layers making a total of no more than four metal layers. Such a construction and number of levels is highly desirable in the context of CMOS circuitry.

First and second spiral-type inductors 32, 34 are preferably arranged, or can be arranged in a circuit to provide the circuit with a quality factor Q, as described below, which is no less than about 10. Even more preferably, a quality factor Q is provided which is equal to about, or no less than about 15. As discussed above, having Q factors in this range in the context of semiconductive silicon substrates, together with the total number of metal levels necessary for implementing the inductor assembly not exceeding four, constitutes a highly desirable improvement over prior methods which either were unable to realize Q factors in this range in silicon, or needed more than four metal levels to implement particular inductors.

Various embodiments of the invention provide inductance-multiplying methods which constitute improvements over prior known methods. In one embodiment, a monolithic substrate is provided having formed thereon integrated circuitry which is formed through complementary metal oxide semiconductor (CMOS) techniques. The circuitry preferably comprises a field effect transistor, such as transistor 22, and a pair of inductors, such as inductors 32, 34. The field effect transistor and the pair of inductors are preferably arranged into a circuit configuration (see FIG. 1) in which the field effect transistor is configured to sample one of the pair of inductors, e.g. inductor 32, and drive the other of the pair of inductors, e.g. inductor 34. By arranging the circuit as just described, the inductance of the sampled inductor is effectively increased. In one embodiment, the substrate is provided as a monocrystalline substrate. In another embodiment, the substrate is provided as a monocrystalline, silicon-containing substrate. In another embodiment, provision of the monolithic substrate having the described integrated circuitry thereon comprises fabricating the integrated circuitry. In one fabrication embodiment, one of the inductors is fabricated to be larger than the other of the inductors. Preferably, the larger of the inductors is fabricated to be disposed elevationally over the other of the inductors.

In yet another embodiment, integrated circuitry is fabricated to comprise a MOSFET having a gate, a drain, and a source. One of the pair of inductors is fabricated to be larger than the other of the pair of inductors and is connected to the gate of the transistor. An exemplary circuit is shown in FIG. 1. The other of the pair of inductors is fabricated to be connected to the source of the transistor.

In the illustrated and preferred embodiment, the arranging of the integrated circuitry into the described circuit configuration comprises providing a suitable voltage potential(s) to render the field effect transistor operative. In the specific illustrated example shown in FIG. 1, the integrated circuitry is arranged into a source-follower configuration. Other circuit configurations utilizing various inventive principles described above and below can be assembled or fabricated.

As discussed above, one of the advantages of the present invention is that various circuits which utilize the inventive concepts can be realized through or in connection with CMOS fabrication techniques. Given the difficulty in fabricating inductors in CMOS integrated circuits, as opposed to, for example, GaAs MESFET circuits, the present invention provides solutions relating to the need for techniques to produce high inductance and high-Q elements in CMOS integrated circuits.

In accordance with various embodiments of the invention, an active inductor circuit utilizes a MOSFET to achieve a multiplication of inductance values and a multiplication of Q values by compensating for the losses in spiral inductors fabricated over silicon substrates. The circuit shown in FIG. 1 illustrates but one example of a MOSFET which is employed to achieve these objectives.

For purposes of a better understanding of the invention, the circuit of FIG. 1 is compared to a simple passive inductor, and certain derivations relative to the two are set forth below. In one example, the active circuit of FIG. 1 utilized an inductor $L_1$ which has an inductance of 9 nH and a resistance of 100 ohms. Such provides a low-valued and high loss inductor. On the other hand, the passive circuit equivalent requires a larger inductor, e.g. 46 nH, to achieve the same resonant frequency near 3 GHz and, likewise, has a larger coil resistance, e.g. around 600 ohms. And, while the passive circuit equivalent can resonate near 3 GHz, its Q value is equal to around 1.5, rather than a desirable Q value of around 15. Clearly, the active circuit which employs the MOSFET has a smaller inductor area thereby taking up much less wafer area and, at the same time, providing a high quality factor Q which is suitable for use in the frequency range mentioned above.

The design of the active circuit shown in FIG. 1, without any coil resistance, is seemingly simple but, in reality, is fairly complicated. This circuit is, in reality, a positive feedback circuit with a loop gain which is less than the order of 1, if $k^2 < L_2/L_1$, and since the amplifier is a source follower with a gain of one or less. The parameter k, just referenced, is the coupling coefficient between the two coils, where the mutual inductance $M = k(L_1/L_2)^{1/2}$.

Figure 3:
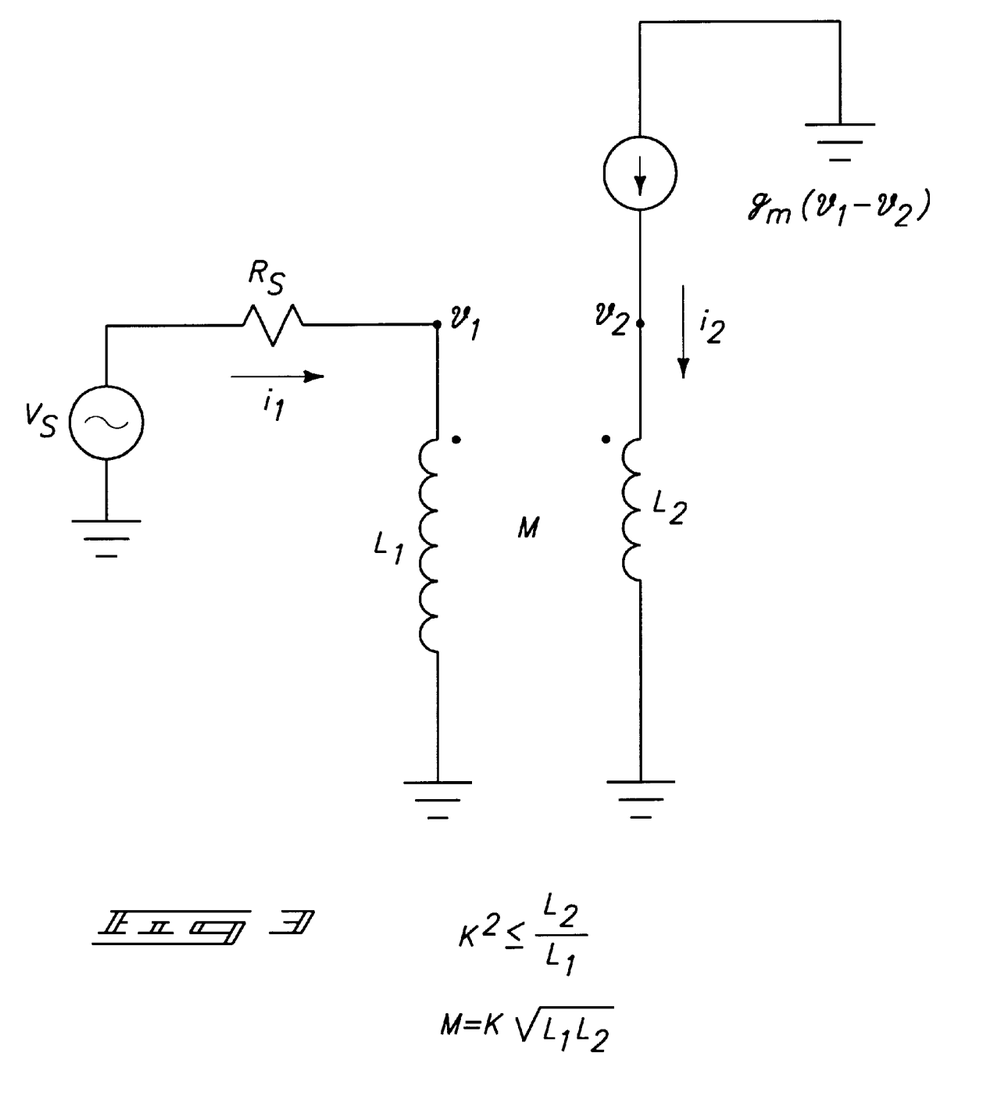
FIG. 3 is a schematic circuit diagram which is used in connection with certain derivations to assist in understanding the invention.

The equation derived just below results from the solution of the circuit node equations, in the simple case, where there is no coil resistance. Such a circuit is shown in FIG. 3.

$$V_1 = i_1(sL_1) + i_2(sM)$$

$$V_2 = i_1(sM) + i_2(sL_2)$$

where $$i_2 = g_m(V_1 - V_2)$$

$$Z = \frac{V_1}{i_1} = \frac{sL_1(1 + g_m sL_2 - g_m sk^2 L_2)}{(1 + g_m sL_2 - g_m sM)}$$

Figure 2:
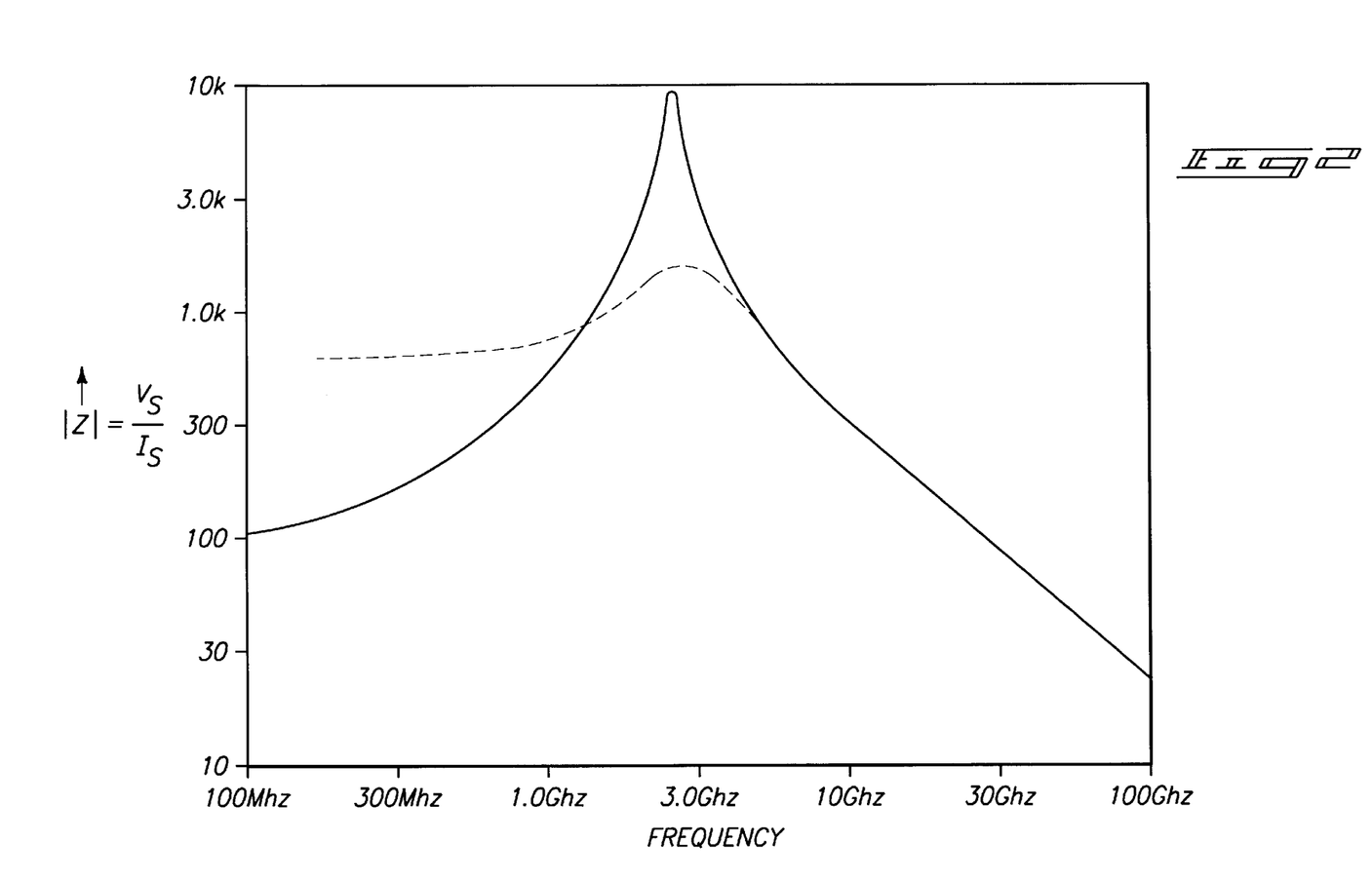
FIG. 2 is a graph which is useful in understanding the operation of one or more embodiments of the invention.

In the above equations, $s = j\omega$. Quite surprisingly, not only does this result in an effective multiplication of the input impedance $Z = V_1/i_1$, or effective multiplication of the inductance, resulting in an impedance of around 1000 ohms (46 nH) at 3 GHz, rather than just the 9 nH (170 ohms) at 3 GHz, but also a negative impedance (FIG. 5) since the phase angle is larger than 90° as shown in FIG. 4. If there is no other positive resistance in the circuit, such as a coil resistance, this circuit is potentially unstable. In reality, however, all practical circuits have coil resistances (such as resistance $R_c$ in FIG. 1) which can bring the circuit toward stability. If the circuit is designed correctly, as the graph in FIG. 2 describes, the circuit will be stable. The dashed line in FIG. 2 constitutes the performance characteristics of the above-described passive circuit, while the solid line represents the performance characteristics of an active circuit in accordance with the invention. The negative resistance above serves to compensate for the coil losses and results, in part, in the Q multiplication.

Figure 6:
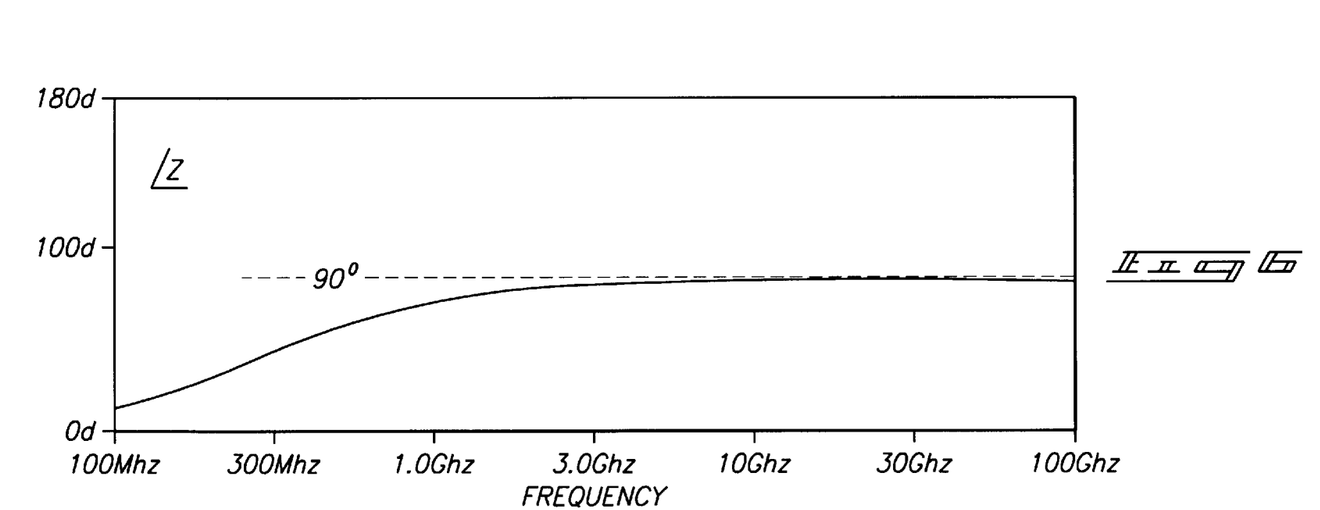
FIG. 6 is a graph which is useful in understanding one or more embodiments of the invention.
Figure 7:
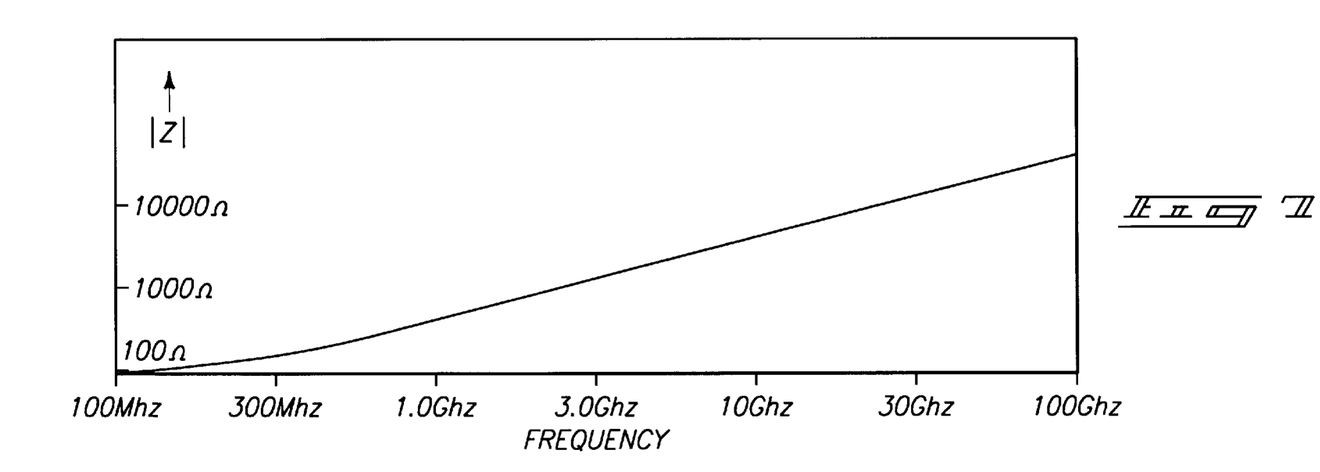
FIG. 7 is a graph which is useful in understanding one or more embodiments of the invention.

FIGS. 6 and 7 show the impedance looking at node 1 ($V_1$ in FIG. 3) with a coil resistance of 100 ohms. Note that the phase angle is always less than 90° so there is no negative resistance and the circuit is stable.

A more detailed analytical investigation has been made of the circuit in FIG. 1, including the coil resistance $R_c$, and any additional stray resistance or resistance which might be added to the circuit to ensure stability. Somewhat complicated algebraic equations follow which can be simplified if it is assumed that:

$$(\omega g_m(L_2-M))^2 >> 1$$

and $$g_m R_c >> 1$$

With this assumption, the effective inductance, $L_{eff}$ is the multiplied inductance $L_{eff}=M_1/L_1$, where $M_1$ is given by the equation:

$$M_1 = L_2(1-k^2)/(L_2-M) + g_m R_c M/(L_1(\omega g_m(L_2-M))^2)$$

This detailed analysis also yields a condition on the minimum value of resistance $R_c$ which will ensure there is no negative resistance at the input. Such is given by the following equation:

$$R_c > L_1(1-k^2)/(g_m(L_2-M))$$

Using the values for the circuit in FIG. 1 results in a multiplication of the inductance by a factor of six and requires a resistance $R_c$ of around 100 ohms or more. Using the same approximations, one can find that the Q of the new circuit resonated at 3 GHz with a 0.07 pF capacitor is given by:

$$Q = \omega L_2(1-k^2)/(g_m R_c(L_2/L_1) - L^2(1-k_2)/(L_2-M))$$

Since the denominator involves differences between larger numbers, the denominator can be small and the Q of the circuit can be around 15.

With respect to stability, a few conditions must be considered. The first condition relates to the well known Nyquist criteria for feedback circuits. This circuit is, in reality, a positive feedback circuit, but can be and will be stable if the loop gain is less than one. Since the amplifier, in this example the source follower, has at most a gain of one, then this condition can be ensured by making the loop gain of the feedback loop, the transformer, have a gain less than one by making:

$$k^2 < L_2/L_1 \text{ or } 0.6667$$

Another condition to ensure absolute stability and avoid any possibility of oscillations or ringing in the circuit is also to make the real part of the impedance or resistance looking into the circuit positive. This, as detailed above, requires a minimum on the losses in the coil(s) and circuit represented here by $R_c$. If the resistance of the coil is not large enough, some additional series resistance can be included to make:

$$g_m R_c > L_1(1-k^2)/(L_2-M)$$

With respect to noise, at low frequencies the input impedance of the circuit is simply $R_c$, and has added to it the thermal noise of this resistor, $4(kT) R_c \Delta f$ ($V^2/Hz$). The inductance and multiplied inductance becomes important only at high frequencies, typically over 100 MHz. As a result one can neglect the low frequency noise of the FET and consider only the channel mean square noise current. An analysis of an equivalent circuit yields two components to the noise at the input node, the resistor noise:

$$4(kT)R_c\Delta f (V^2/Hz. Hz),$$

and the added noise due to the transistor when $g_m sL_2$ is >>1, at high frequencies:

$$(8/3)(kT)(1/g_m)(M/(L_2-M))^2 \Delta f (V^2/Hz. Hz)$$

where ($M/(L_2-M)$) is a multiplication factor similar to one which multiplied the inductance. The total mean square noise voltage at the input will be the sum of these two components. However, since $1/g_m$ is smaller than $R_c$, typically these two components will be around the same order of magnitude so the FET does not introduce much additional noise.

Various advantages can be achieved by the inventive structures and methods among which are included improved or enhanced inductance values and Q factors in the context of silicon processing techniques, e.g. CMOS techniques. Further, reductions in the consumption of wafer real estate can be achieved with improved Q factors at the frequencies of interest. Moreover, very large scale integration of analog, digital and RF functions can be enabled by the present invention, with a particular utility in the integrated RF front end circuit such as those which are used in connection with portable wireless communication products.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A monolithic inductance-enhancing integrated circuit comprising:
   a transistor supported by a bulk monocrystalline silicon substrate; and
   an inductor assembly supported by the substrate and operably connected with the transistor in an inductance-enhancing circuit configuration having a quality factor Q greater than or equal to about 10.

2. The monolithic inductance-enhancing integrated circuit of claim 1, wherein the quality factor Q of the circuit configuration is no less than 15.

3. The monolithic inductance-enhancing integrated circuit of claim 1, wherein the transistor comprises a field effect transistor.

4. The monolithic inductance-enhancing integrated circuit of claim 1, wherein the transistor comprises a metal oxide field effect transistor (MOSFET).

5. The monolithic inductance-enhancing integrated circuit of claim 1, wherein the inductor assembly comprises two inductors.

6. The monolithic inductance-enhancing integrated circuit of claim 1, wherein the transistor comprises a field effect transistor having a gate, a drain, and a source, and the inductor assembly comprises two inductors, one of the inductors being connected to the gate, the other of the inductors being connected to the source.

7. The monolithic inductance-enhancing integrated circuit of claim 1, wherein the inductor assembly comprises two spiral-type inductors.

8. The monolithic inductance-enhancing integrated circuit of claim 1, wherein the transistor comprises a field effect transistor having a gate, a drain, and a source, and the inductor assembly comprises two spiral-type inductors, one of the inductors being connected to the gate, the other of the inductors being connected to the source.

9. The monolithic inductance-enhancing integrated circuit of claim 1, wherein the inductor assembly comprises two spiral-type inductors, and wherein one of the inductors is disposed over the other of the inductors.

10. The monolithic inductance-enhancing integrated circuit of claim 1, wherein the transistor comprises a field effect transistor having a gate, a drain, and a source, and wherein the inductor assembly comprises two spiral-type inductors, wherein one of the inductors is disposed over the other of the inductors, and wherein said one inductor is connected to the gate and the other of the inductors is connected to the source.

11. The monolithic inductance-enhancing integrated circuit of claim 1, wherein the inductor assembly comprises two spiral-type inductors, one of the inductors being larger than the other of the inductors, the larger of the inductors being disposed over the smaller of the inductors.

12. The monolithic inductance-enhancing integrated circuit of claim 1, wherein the transistor comprises a field effect transistor having a gate, a drain, and a source, and the inductor assembly comprises two spiral-type inductors, one of the inductors being larger than the other of the inductors, the larger of the inductors being disposed over the smaller of the inductors, and wherein the larger of the inductors is connected to the gate and the smaller of the inductors is connected to the source.

13. A complementary metal oxide semiconductor (CMOS), inductance-enhancing integrated circuit comprising:
   a field effect transistor received by and supported over a silicon-containing substrate and having a gate, a source, and a drain;
   a first inductor received within an insulative layer of material supported by the substrate, the first inductor being connected to the gate; and
   a second inductor received within an insulative layer of material supported by the substrate, the second inductor being connected to the source, the first and second inductors being arranged in a feedback loop which incorporates the field effect transistor.

14. The CMOS inductance-enhancing integrated circuit of claim 13, wherein one of the first and second inductors is larger than the other of the first and second inductors.

15. The CMOS inductance-enhancing integrated circuit of claim 13, wherein one of the first and second inductors is a spiral-type inductor.

16. The CMOS inductance-enhancing integrated circuit of claim 13, wherein both of the first and second inductors are spiral-type inductors.

17. The CMOS inductance-enhancing integrated circuit of claim 13, wherein one of the first and second inductors is larger than the other of the first and second inductors, and wherein both of the first and second inductors are spiral-type inductors.

18. The CMOS inductance-enhancing integrated circuit of claim 13, wherein the first inductor is larger than the second inductor.

19. The CMOS inductance-enhancing integrated circuit of claim 13, wherein one of the inductors is disposed over the other of the inductors.

20. The CMOS inductance-enhancing integrated circuit of claim 13, wherein one of the first and second inductors is larger than the other of the first and second inductors, the larger of the inductors being received over the smaller of the inductors.

21. The CMOS inductance-enhancing integrated circuit of claim 13, wherein:
   both of the first and second inductors are spiral-type inductors;
   the first inductor is larger than the second inductor; and
   the larger of the inductors is received over the smaller of the inductors.

22. An inductor assembly comprising:
   a semiconductive silicon substrate;
   a field effect transistor formed on the substrate and having a gate, source and drain;
   a first spiral-type inductor received over the semiconductive silicon substrate and defining a first inductor level, the first inductor being operably coupled to the gate; and
   a second spiral-type inductor received over the semiconductive silicon substrate and inductively coupled with the first spiral inductor and defining a second inductor level, the inductor assembly having no more than four inductor levels, the second inductor being operably coupled to the source.

23. The inductor assembly of claim 22, wherein the first and second spiral-type inductors are arranged in a circuit to provide the circuit with a quality factor Q which is no less than about 10.

24. The inductor assembly of claim 22, wherein the first and second spiral-type inductors are arranged in a circuit to provide the circuit with a quality factor Q which is no less than about 15.

25. The monolithic inductance-enhancing integrated circuit of claim 1, wherein the transistor comprises a field effect transistor having a gate, a source and a drain, and wherein the inductor assembly comprises a pair of inductively-coupled spiral inductors, a first of the pair of spiral inductors being coupled to the gate and a second of the pair of spiral inductors being coupled to the source.

26. The monolithic inductance-enhancing integrated circuit of claim 1, wherein the transistor comprises a field effect transistor having a gate, a source and a drain, and wherein the inductor assembly comprises a pair of inductively-coupled spiral inductors, a first of the pair of spiral inductors having an inductance $L_1$ and being coupled to the gate and a second of the pair of spiral inductors having an inductance $L_2$ and being coupled to the source, the transistor and inductor assembly being configured to provide an effective inductance exhibited at terminals of the first inductor of $L_{EFF}=L_1 M_1$, wherein $M_1$ is determined in part from characteristics of the transistor and in part from characteristics of the second of the pair of spiral inductors.

27. The monolithic inductance-enhancing integrated circuit of claim 1, wherein the transistor comprises a field effect transistor having a gate, a source and a drain, and wherein the inductor assembly comprises a pair of inductively-coupled spiral inductors, a first of the pair of spiral inductors having an inductance $L_1$ and being coupled to the gate and a second of the pair of spiral inductors having an inductance $L_2$ and being coupled to the source, the transistor and the first and second spiral inductors being configured to provide an effective inductance $L_{EFF}$ exhibited at terminals of the first spiral inductor of: $L_{EFF}=L_1\ M_1=L_1(L_2(1-k^2)/(L_2-M)+g_m R_c M/(L_1(\omega g_m(L_2-M))^2))$, wherein $M_1$ is determined in part from characteristics of the transistor and in part from characteristics of the second of the pair of spiral inductors, k is a coupling coefficient describing coupling between the two coils, $M=k\ (L_1 * L_2)^{1/2}$, $\omega$ is a radian frequency and $g_m$ is a transconductance of the field effect transistor.

28. The monolithic inductance-enhancing integrated circuit of claim 1, wherein the quality factor Q is greater than or equal to about 10 at a frequency of about 3 gigahertz.

29. The CMOS inductance-enhancing integrated circuit of claim 13, further comprising a field effect transistor having a gate, a source and a drain, wherein the first and second spiral-type inductors comprises a pair of inductively-coupled spiral inductors, the first spiral inductor having an inductance $L_1$ and being coupled to the gate, and the second spiral inductor having an inductance $L_2$ and being coupled to the source, the transistor and first and second spiral-type inductors being configured to provide an effective inductance exhibited at terminals of the first spiral inductor of $L_{EFF}=L_1\ M_1$, wherein $M_1$ is determined in part from characteristics of the transistor and in part from characteristics of the second spiral-type inductor.

30. The CMOS inductance-enhancing integrated circuit of claim 13, wherein the first and second inductors comprises a pair of inductively-coupled spiral inductors, the first spiral-type inductor having an inductance $L_1$ and being coupled to the gate, and the second spiral-type inductor having an inductance $L_2$ and being coupled to the source, the transistor and first and second spiral-type inductors being configured to provide an effective inductance $L_{EFF}$ exhibited at terminals of the first spiral-type inductor of $L_{EFF}=L_1\ M_1=L_1(L_2(1-k^2)/(L_2-M)+g_m R_c M/(L_1(\omega g_m(L_2-M))^2))$, wherein $M_1$ is determined in part from characteristics of the transistor and in part from characteristics of the second of the pair of spiral inductors, k is a coupling coefficient describing coupling between the two coils, $M=k\ (L_1 * L_2)^{1/2}$, $\omega$ is a radian frequency and $g_m$ is a transconductance of the field effect transistor.

31. The inductor assembly of claim 22, further comprising a field effect transistor having a gate, a source and a drain, wherein the first and second spiral-type inductors comprises a pair of inductively-coupled spiral inductors, the first spiral inductor having an inductance $L_1$ and being coupled to the gate, and the second spiral inductor having an inductance $L_2$ and being coupled to the source, the transistor and first and second spiral-type inductors being configured to provide an effective inductance exhibited at terminals of the first spiral inductor of $L_{EFF}=L_1\ M_1$, wherein $M_1$ is determined in part from characteristics of the transistor and in part from characteristics of the second spiral-type inductor.

32. The inductor assembly of claim 22, wherein the first and second inductors comprises a pair of inductively-coupled spiral inductors, the first spiral-type inductor having an inductance $L_1$ and being coupled to the gate, and the second spiral-type inductor having an inductance $L_2$ and being coupled to the source, the transistor and first and second spiral-type inductors being configured to provide an effective inductance $L_{EFF}$ exhibited at terminals of the first spiral-type inductor of: $L_{EFF}=L_1\ M_1=L_1(L_2(1-k^2)/(L_2-M)+g_m R_c M/(L_1(\omega g_m(L_2-M))^2))$, wherein $M_1$ is determined in part from characteristics of the transistor and in part from characteristics of the second of the pair of spiral inductors, k is a coupling coefficient describing coupling between the two coils, $M=k\ (L_1 * L_2)^{1/2}$, $\omega$ is a radian frequency and $g_m$ is a transconductance of the field effect transistor.

33. The inductor assembly of claim 23, wherein the first and second spiral-type inductors are arranged in a circuit to provide the circuit with a quality factor Q which is no less than about 10 at a frequency of about three Gigahertz.

34. The inductor assembly of claim 24, wherein the first and second spiral-type inductors are arranged in a circuit to provide the circuit with a quality factor Q which is no less than about 15 at a frequency of about three Gigahertz.

* * * * *

UNITED STATES PATENT AND TRADEMARK OFFICE
CERTIFICATE OF CORRECTION

PATENT NO. : 6,201,287 B1  
DATED : March 13, 2001  
INVENTOR(S) : Leonard Forbes It is certified that error appears in the above-identified patent and that said Letters Patent is hereby corrected as shown below:

Column 6,
Line 37, delete "$M = k\ (L_1/L_2)^{1/2}$" and insert -- $M = k\ (L_1 L_2)^{1/2}$ --.

Column 7,
Line 21, delete "$L_{eff} = M_1/L_1$" and insert -- $L_{eff} = M_1 L_1$ --.
Line 40, delete the entire equation and insert:
-- $Q = \omega L_2(1-k^2)/(g_m R_c(L_2/L_1) - L_2(1-k^2)/(L_2-M)\ )$ --.

Signed and Sealed this

Eighteenth Day of December, 2001

Attest:

JAMES E. ROGAN
*Attesting Officer*     *Director of the United States Patent and Trademark Office*